United States Patent
Liaw et al.

[11] Patent Number: 6,127,269
[45] Date of Patent: *Oct. 3, 2000

[54] METHOD FOR ENHANCING SHEET RESISTANCE UNIFORMITY OF CHEMICAL VAPOR DEPOSITED (CVD) TUNGSTEN SILICIDE LAYERS

[75] Inventors: Yung-Haw Liaw; May-Ling Chu, both of Hsin-Chu, Taiwan

[73] Assignee: Taiwan Semiconductor Manufacturing Company, Hsin-Chu, Taiwan

[*] Notice: This patent issued on a continued prosecution application filed under 37 CFR 1.53(d), and is subject to the twenty year patent term provisions of 35 U.S.C. 154(a)(2).

[21] Appl. No.: 08/747,499

[22] Filed: Nov. 12, 1996

[51] Int. Cl.$^7$ .................................................. H01L 21/44
[52] U.S. Cl. ........................... 438/682; 438/905; 438/683
[58] Field of Search ..................... 438/682, 680, 438/683, 905; 134/22.1, 1.1, 1.2

[56] References Cited

U.S. PATENT DOCUMENTS

| | | |
|---|---|---|
| 5,129,958 | 7/1992 | Nagashima et al. .................... 134/22.1 |
| 5,207,836 | 5/1993 | Chang ......................................... 134/1 |
| 5,326,723 | 7/1994 | Petro et al. . |
| 5,413,669 | 5/1995 | Fujita ..................................... 156/643.1 |
| 5,434,096 | 7/1995 | Chu et al. ................................. 437/44 |
| 5,632,821 | 5/1997 | Doi . |
| 5,647,953 | 7/1997 | Williams et al. . |
| 5,780,360 | 7/1998 | Tseng et al. . |
| 5,849,092 | 12/1998 | Xoi et al. . |
| 6,022,586 | 2/2000 | Hashimoto et al. ..................... 427/237 |

*Primary Examiner*—Caridad Everhart
*Attorney, Agent, or Firm*—George O. Saile; Stephen B. Ackerman; Alek P. Szecsy

[57] ABSTRACT

A chemical vapor deposition (CVD) method for forming with enhanced sheet resistance uniformity tungsten silicide layers upon substrates. There is formed upon a first substrate within a chemical vapor deposition (CVD) reactor chamber a first tungsten silicide layer through a chemical vapor deposition (CVD) method. The first substrate is then removed from the chemical vapor deposition (CVD) reactor chamber. The chemical vapor deposition (CVD) reactor chamber is then cleaned with a fluorine containing plasma and subsequently purged with a mixture of silane and an inert gas. There may then be formed with enhanced sheet resistance uniformity upon a second substrate within the chemical vapor deposition (CVD) reactor chamber a second tungsten silicide layer through the chemical vapor deposition (CVD) method.

10 Claims, 3 Drawing Sheets

METHOD FOR ENHANCING SHEET RESISTANCE UNIFORMITY OF CHEMICAL VAPOR DEPOSITED (CVD) TUNGSTEN SILICIDE LAYERS

BACKGROUND OF THE INVENTION

1. Field of the Invention

The present invention relates generally to methods for forming tungsten silicide layers within integrated circuits. More particularly, the present invention relates to methods for forming with enhanced sheet resistance uniformity chemical vapor deposited (CVD) tungsten silicide layers within integrated circuits.

2. Description of the Related Art

Integrated circuits are formed from semiconductor substrates within and upon whose surfaces are formed resistors, transistors, diodes and other electrical circuit elements. The electrical circuit elements are connected internally and externally to the semiconductor substrate upon which they are formed through patterned conductor layers which are separated by dielectric layers.

As integrated circuit device dimensions have decreased and integrated circuit device performance requirements have increased, it has become increasingly important to form within integrated circuits integrated circuit devices and connections, such as gate electrode interconnect connections, whose electrodes have uniform and low sheet resistances. Such uniform and low sheet resistances of integrated circuit device and connection electrodes, such as gate electrode interconnect connection electrodes, provide integrated circuit devices and connections from which there may be formed integrated circuits with optimal performance and reliability characteristics.

A common method for forming low sheet resistance connections to integrated circuit device electrodes within integrated circuits, and in particular to gate electrodes within field effect transistors (FETs) within integrated circuits, is to form upon those integrated circuit device electrodes metal silicide layers which are known in the art to inherently provide low sheet resistance layers to which electrical circuit connections may be formed. Of the metal silicide layers which may be employed in forming low sheet resistance metal silicide layers upon integrated circuit device electrodes within integrated circuits, tungsten silicide layers are particularly common. While low sheet resistance tungsten silicide layers may be formed within integrated circuits through methods including but not limited to self-aligned thermal annealing methods, chemical vapor deposition (CVD) methods and physical vapor deposition (PVD) sputtering methods, the present invention is directed in general towards forming with enhanced properties low sheet resistance tungsten silicide layers within integrated circuits through chemical vapor deposition (CVD) methods. When forming such chemical vapor deposited (CVD) tungsten silicide layers within integrated circuits it is common in the art to employ tungsten hexafluoride (WF6) as a tungsten source material and silane (SiH4), or another appropriate silicon containing gas, as a silicon source material.

While chemical vapor deposition (CVD)) methods for forming tungsten silicide layers from tungsten hexafluoride and a suitable silicon source material are common in the art, tungsten silicide layers formed through such chemical vapor deposition (CVD) methods are not entirely without problems. In particular, while tungsten silicide layers formed through chemical vapor deposition (CVD)) methods typically provide the low sheet resistance desired for electrode connections to integrated circuit devices formed within advanced integrated circuits, tungsten silicide layers formed through chemical vapor deposition (CVD) methods typically have an enhanced sheet resistance non-uniformity. Significant sheet resistance non-uniformity of tungsten silicide layers within integrated circuits is undesirable since it may contribute to undesirable variations in integrated circuit performance or reliability.

Thus, it is desirable in the art of integrated circuit fabrication to provide uniformly low sheet resistance chemical vapor deposited (CVD) tungsten silicide layers for low sheet resistance connections to integrated circuit device electrodes within integrated circuits. It is towards that goal that the present invention is specifically directed.

Methods and materials through which tungsten layers or tungsten silicide layers may be formed with desirable properties within integrated circuits are known in the art of integrated circuit fabrication. For example, Fujita in U.S. Pat. No. 5,413,669 discloses a method for forming a tungsten contact layer over a titanium underlayer within an integrated circuit, where the resulting layered structure has a limited amount of residual titanium-tungsten-fluorine alloy formed therein. The titanium-tungsten-fluorine alloy originally formed therein is removed through an etching process which leaves the layered structure largely intact. In addition, Chu et al. in U.S. Pat. No. 5,434,096 disclose a method for preventing bubble formation between a tungsten silicide layered polycide gate electrode within a field effect transistor within an integrated circuit and a dielectric layer formed over the tungsten silicide layered polycide gate electrode. The method employs a high temperature degassing process step prior to forming the dielectric layer over the tungsten silicide layered polycide gate electrode.

Most pertinent to the present invention, however, is the disclosure of Petro et al. in U.S. Pat. No. 5,326,723. Petro et al. disclose a method for cleaning a tungsten chemical vapor deposition (CVD) reactor chamber after forming a tungsten layer upon a substrate within the reactor chamber. After removing the substrate from the reactor chamber, the reactor chamber is exposed to at least one plasma, followed by purging the reactor chamber with a mixture of silane and argon. Through the method, a second tungsten layer subsequently formed through the chemical vapor deposition (CVD) method upon a second substrate within the reactor chamber is formed with enhanced stability and uniformity.

While Petro et al. disclose a method for cleaning a reactor chamber employed in forming chemical vapor deposited (CVD) tungsten layers upon substrates within the reactor chamber, there is no indication that the methods and materials employed by Petro et al. are applicable beyond forming through chemical vapor deposition (CVD) methods tungsten layers with enhanced stability and uniformity.

Thus, it is desirable in the art to provide methods and materials through which tungsten silicide layers formed within integrated circuits through chemical vapor deposition (CVD) methods may similarly be formed with enhanced uniformity, particularly sheet resistance uniformity.

SUMMARY OF THE INVENTION

A first object of the present invention is to provide a method for forming within an integrated circuit a tungsten silicide layer through a chemical vapor deposition (CVD) method.

A second object of the present invention is to provide a method in accord with the first object of the present invention, where the tungsten silicide layer is formed with enhanced sheet resistance uniformity.

In accord with the objects of the present invention, there is provided by the present invention a chemical vapor deposition (CVD) method for forming with enhanced sheet resistance uniformity a tungsten silicide layer upon a substrate. To practice the method of the present invention, there is formed upon a first substrate within a chemical vapor deposition (CVD) reactor chamber a first tungsten silicide layer through a chemical vapor deposition (CVD) method. The first substrate is then removed from the reactor chamber. The chemical vapor deposition (CVD) reactor chamber is then cleaned through a plasma etch method employing a fluorine containing plasma. The reactor chamber is then purged with a mixture of silane and an inert gas. Finally, there is formed upon a second substrate within the reactor chamber a second tungsten silicide layer through the chemical vapor deposition (CVD) method.

The present invention provides a chemical vapor deposition (CVD) method for forming with enhanced sheet resistance uniformity a tungsten silicide layer upon a substrate. While the mechanism through which the chemical vapor deposition (CVD) method of the present invention provides the tungsten silicide layer with enhanced sheet resistance uniformity is not entirely well understood, it is believed that the method of the present invention effectively scavenges contaminants, in particular fluorine contaminants, within the chemical vapor deposition (CVD) reactor chamber, which contaminants would otherwise affect the sheet resistance uniformity of a tungsten silicide layer formed through the chemical vapor deposition (CVD) method of the present invention.

BRIEF DESCRIPTION OF THE DRAWINGS

The objects, features and advantages of the present invention are understood thin the context of the Description of the Preferred Embodiment, as set forth below. The Description of the Preferred Embodiment is understood within the context of the accompanying drawings, which form a material part of this disclosure, wherein.

DESCRIPTION OF THE PREFERRED EMBODIMENT

The present invention provides a chemical vapor deposition (CVD) method for forming upon a substrate a tungsten silicide layer with enhanced sheet resistance uniformity. The present invention provides the chemical vapor deposition (CVD) method for forming upon the substrate the tungsten silicide layer with enhanced sheet resistivity uniformity by cleaning the reactor chamber within which is formed upon the substrate the tungsten silicide layer with a fluorine containing plasma. The reactor chamber is then purged with a mixture of silane in an inert gas. While the mechanism through which the chemical vapor deposition (CVD)) method of the present invention provides the tungsten silicide layer with enhanced sheet resistance uniformity is not entirely well understood, it is believed that the method of the present invention effectively scavenges contaminants, in particular fluorine contaminants, within the chemical vapor deposition (CVD) reactor chamber, which contaminants would otherwise affect the sheet resistance uniformity of a tungsten silicide layer formed through the chemical vapor deposition (CVD) method of the present invention.

The method of the present invention may be employed in forming tungsten silicide layers with enhanced sheet resistance uniformity within integrated circuits of various types. The method of the present invention may be employed in forming tungsten silicide layers with enhanced sheet resistance uniformity within integrated circuits including but not limited to dynamic random access memory (DRAM) integrated circuits, static random access memory (SRAM) integrated circuits, integrated circuits having within their fabrications field effect transistors (FETs), integrated circuits having within their fabrications bipolar transistors and integrated circuits having within their fabrications bipolar complementary metal oxide semiconductor (BiCMOS) transistors.

Figure 1:
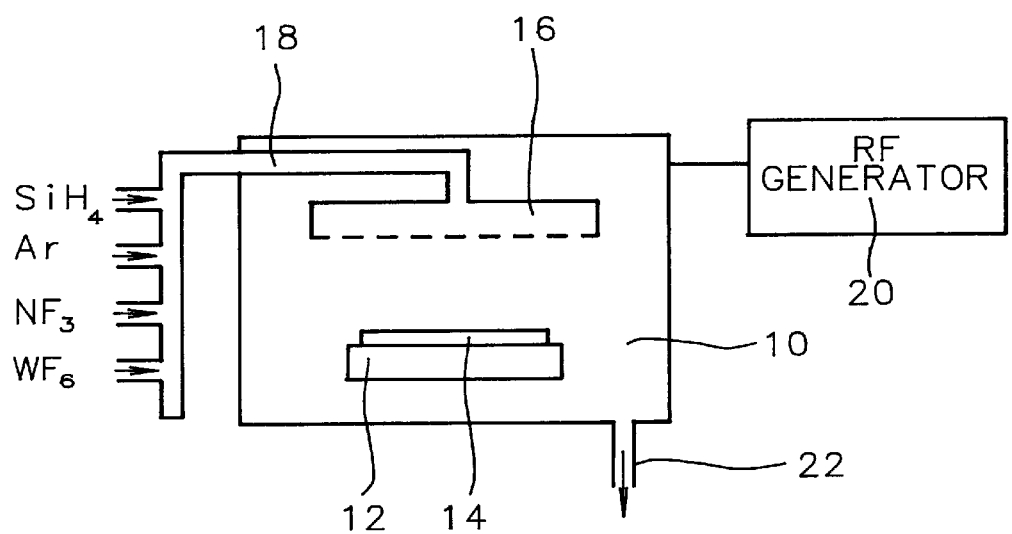
FIG. 1 shows a schematic cross-sectional diagram of a chemical vapor deposition (CVD) reactor apparatus within which may be practiced the method of the present invention.

Referring now to FIG. 1 there is shown a schematic cross-sectional diagram of a chemical vapor deposition (CVD) reactor apparatus within which there may be formed tungsten silicide layers through the method of the present invention. Shown in FIG. 1 is a chemical vapor deposition (CVD) reactor chamber 10 having therein a platen 12 upon which is placed a substrate 14. At least the platen 12, and preferably also the reactor chamber 10, is capable of being heated with a heater (not shown) in order to provide an elevated temperature at which a tungsten silicide layer may be formed through a chemical vapor deposition (CVD) method upon the substrate 14 placed upon the platen 12. In addition, although the substrate 14 may be any of several substrates upon which is desired to form a tungsten silicide layer, the substrate 12 will typically and preferably be a (100) silicon semiconductor substrate from which integrated circuits are commonly formed.

There is also shown in FIG. 1 a manifold 18 connecting a series of source gases with a nozzle 16. While both the manifold 18 and the nozzle 16 are conventional to the art of chemical vapor deposition (CVD) apparatus design and fabrication, both the manifold 18 and the nozzle 16 are preferably designed and fabricated to provide, where needed, and to limit, where not needed, intermixing of source gases employed in forming through a chemical vapor deposition (CVD) method a tungsten silicide layer upon the substrate 14. Excess gases introduced into the reactor chamber 10 are exhausted from the reactor chamber 10, while maintaining the reactor chamber 10 at a desired pressure, through action of a pump (not shown) attached to the exhaust port 22.

There is also shown in FIG. 1 a radio frequency generator 20 coupled to the reactor chamber 10. Although radio frequency excitation is typically not employed in forming through chemical vapor deposition (CVD) methods tungsten silicide layers upon substrates, radio frequency excitation is employed, in part, within the method of the present invention through which the reactor chamber 10 is cleaned after forming a tungsten silicide layer upon the substrate 14 within the reactor chamber 10.

Finally, as is shown in FIG. 1, there is a series of gases provided to the manifold 18. The gases include, but are not limited to silane ($SiH_4$), argon (Ar), nitrogen trifluoride ($NF_3$) and tungsten hexafluoride ($WF_6$). As is further discussed below, the silane gas and the tungsten hexafluoride gas are employed in forming through a chemical vapor deposition (CVD) method a tungsten silicide layer upon the substrate 14. In addition, the nitrogen trifluoride gas is employed in cleaning through a plasma etch method tungsten silicide layer residues from the reactor chamber 10 after the substrate 14 is removed from the reactor chamber 10 after forming through the chemical vapor deposition (CVD) method the tungsten silicide layer upon the substrate 14. Finally, the silane gas and the argon gas are employed within the preferred embodiment of the method of the present invention in purging the reactor chamber 10 after cleaning through the plasma etch method the tungsten silicide layer residues from the reactor chamber 10 prior to forming upon a second substrate similar to the substrate 14 a second tungsten silicide layer through the chemical vapor deposition (CVD) method. Although not specifically illustrated within the chemical vapor deposition (CVD) apparatus whose schematic cross-sectional diagram is illustrated in FIG. 1, there may also be provided to the manifold 18 additional background and/or diluent gases, such as but not limited to nitrogen, hydrogen and helium, in order to provide to the reactor chamber 10 optimized compositions of gases employed within the method of the present invention.

Figure 2:
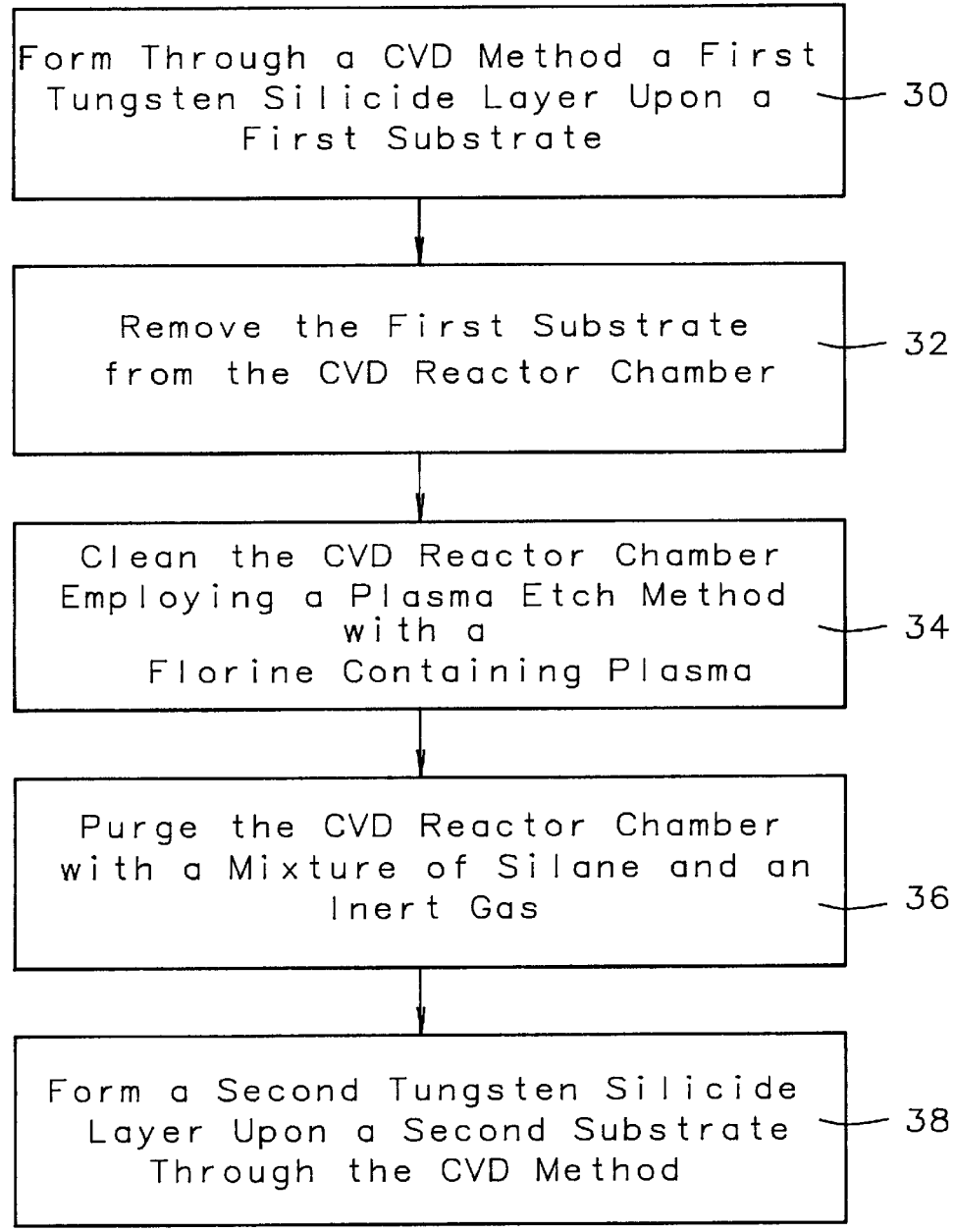
FIG. 2 shows a process flow schematic diagram illustrating the process steps within the method of the present invention.

Referring now to FIG. 2, there is shown a process flow schematic diagram illustrating the progressive process steps in forming upon successive substrates placed within the reactor chamber 10 whose schematic cross-sectional diagram is illustrated in FIG. 1 successive tungsten silicide layers through the chemical vapor deposition (CVD) method of the present invention. Reference numeral 30 shows the first process step within the method.

As shown by reference numeral 30, there is first formed upon a first substrate within the reactor chamber 10 a first tungsten silicide layer through a chemical vapor deposition (CVD) method. When forming the first tungsten silicide layer upon the first substrate through the chemical vapor deposition (CVD) method, it is common and preferred to employ tungsten hexafluoride as a tungsten source material and silane as a silicon source material. Along with the tungsten hexafluoride tungsten source material and the silane silicon source material, it is also common to employ carrier gases such as but not limited to argon, nitrogen, helium and/or hydrogen.

Typical process conditions employed in forming the first tungsten silicide layer upon the first substrate through the chemical vapor deposition (CVD) method include: (1) a reactor chamber pressure of about 500 to about 1200 mtorr; (2) a substrate temperature of from about 300 to about 500 degrees centigrade; (3) a tungsten hexafluoride flow of from about 2.5 to about 4.0 standard cubic centimeters per minute (sccm); (4) a silane flow of from about 200 to about 800 standard cubic centimeters per minute (sccm); and (5) an inert background gas flow, such as but not limited to an argon flow, of from about 200 to about 1000 standard cubic centimeters per minute (sccm). Typically, the first tungsten silicide layer is formed upon the first substrate to a thickness of from about 1000 to about 3000 angstroms. After forming through the chemical vapor deposition (CVD) method the first tungsten silicide layer upon the first substrate, the first substrate is, as illustrated by the second process step corresponding to reference numeral 32, removed from the chemical vapor deposition (CVD) reactor chamber.

When forming through the chemical vapor deposition (CVD) method the first tungsten silicide layer upon the first substrate, there is simultaneously formed tungsten silicide layer residues upon various surfaces other than the first substrate surface within the reactor chamber 10. In order in general to assure a more homogeneous reactor chamber 10 environment within which there may be formed tungsten silicide layers upon substrates subsequent to the first substrate, it is desired to remove the tungsten silicide layer residues from upon the various surfaces within the reactor chamber 10 prior to forming upon those subsequent substrates subsequent tungsten silicide layers through the chemical vapor deposition (CVD) method. Similarly with the prior art directed towards forming tungsten layers upon substrates similar to the substrate 14 (ie: see Petro et al., U.S. Pat. No. 5,326,723 as discussed within the Description of the Related Art), tungsten silicide layer residues are also typically removed from reactor chambers such as the reactor chamber 10 through cleaning through a plasma etch method employing a fluorine containing etchant gas. Typically, although not exclusively, the fluorine containing etchant gas is nitrogen trifluoride, although other fluorine containing etchant gases, such as but not limited to carbon tetrafluoride and hexafluoroethane may also be employed. Such other fluorine containing etchant gases will typically exhibit less optimal performance in forming a fluorine containing plasma in comparison with nitrogen trifluoride, since nitrogen trifluoride is a particularly efficient source material from which to form fluorine containing plasmas.

Thus, within the third process step of the preferred embodiment of the method of the present invention, as illustrated by reference numeral 34 within FIG. 2, the reactor chamber 10 is cleaned through a plasma etch method with a fluorine containing plasma. Preferably, the fluorine containing plasma is a nitrogen trifluoride plasma employed at: (1) a reactor chamber pressure of from about 100 to about 1000 mtorr; (2) a radio frequency power of from about 100 to about 500 watts at a radio frequency of 13.56 MHZ; (3) a reactor chamber temperature of from about 300 to about 500 degrees centigrade; and (4) a nitrogen trifluoride flow rate of from about 100 to about 300 standard cubic centimeters per minute (sccm), for a time period sufficient to completely remove the tungsten silicide layer residues from the reactor chamber 10. Typically, the time period is from about 10 to about 30 seconds, although the time period may be monitored and controlled through end point detection methods as are conventional in the art.

Referring again to FIG. 2, there is shown by reference numeral 36 the fourth process step in the preferred embodiment of the method of the present invention. Shown by reference numeral 36 is a purge process step through which the reactor chamber 10 is purged after cleaning the reactor chamber 10 through the plasma etch method with the fluorine containing plasma. As illustrated by reference numeral 36, the purge step employs silane and an inert gas. Although any of several inert gases may be employed, including but not limited to argon, nitrogen and helium, the inert gas employed within the preferred embodiment of the method of the present invention is preferably argon.

Preferably, the reactor chamber 10 is purged with the mixture of silane and the inert gas employed at: (1) a reactor chamber pressure of from about 100 to about 1000 mtorr; (2) a reactor chamber temperature of from about 300 to about 500 degrees centigrade; (3) a silane flow rate of from about 100 to about 1000 standard cubic centimeters per minute (sccm); and (4) an argon flow rate of from about 100 to about 1500 standard cubic centimeters per minute (sccm), for a time period of from about 5 to about 30 seconds. Preferably, there is not employed any radio frequency excitation when purging the reactor chamber 10 with the mixture of silane and the inert gas. Preferably, the concentration of silane within the inert gas is from about 30 to about 70 volume percent of the aggregate volume of the mixture of silane and the inert gas employed in purging the reactor chamber 10.

Referring again to FIG. 2, there is shown by reference numeral 38 the last process step within the preferred embodiment of the method of the present invention. Shown by reference numeral 36 is a process step for forming through the chemical vapor deposition (CVD) method a second tungsten silicide layer upon a second substrate within the reactor chamber 10. When employing the chemical vapor deposition (CVD) method for forming the second tungsten silicide layer upon the second substrate, there is employed the same parameters and limits employed in forming the first tungsten silicide layer upon the first substrate. Similarly, the second tungsten silicide layer formed upon the second substrate is also preferably formed to a thickness equivalent to the first tungsten silicide layer formed upon the first substrate.

Upon forming through the chemical vapor deposition (CVD) method the second tungsten silicide layer upon the second substrate through the preferred embodiment of the method of the present invention, or forming through the chemical vapor deposition (CVD) method a subsequent tungsten silicide layer upon a subsequent substrate through the preferred embodiment of the method of the present invention, there is formed a series of tungsten silicide layers upon a series of substrates where the series of tungsten silicide layers has enhanced sheet resistance uniformity in comparison with tungsten silicide layers formed upon substrates wherein there is not provided the fluorine containing plasma etch clean method and subsequent silane in inert gas purge of the method of the present invention.

Although not specifically illustrated by the process flow schematic diagram of FIG. 2 it is noted that within the preferred embodiment of the method of the present invention the fourth process step 36 for the purge of the reactor chamber employing the mixture of silane with the inert gas is preferably undertaken immediately subsequent to the third process step 34 for cleaning the reactor chamber through the plasma etch method employing the fluorine containing plasma. In this regard, the preferred embodiment of the method of the present invention provides a more efficient chemical vapor deposition (CVD) method for forming tungsten silicide layers with enhanced sheet resistance uniformity than does the chemical vapor deposition (CVD) method disclosed within the Description of the Related Art provide an analogous chemical vapor deposition (CVD) method for forming tungsten layers with enhanced uniformity and stability (ie: see Petro et al., U.S. Pat. No. 5,326,723, the teachings of which are incorporated herein by reference). While Petro et al. preferably employ nitrogen and hydrogen plasmas in conjunction with a nitrogen trifluoride plasma to clean a tungsten chemical vapor deposition (CVD) reactor chamber prior to purging the reactor chamber with a mixture of silane and argon, the method of the present invention achieves substantial increases in sheet resistance uniformity of tungsten silicide layers formed within a tungsten silicide chemical vapor deposition (CVD) reactor chamber without the use of intervening nitrogen and hydrogen plasmas when cleaning the reactor chamber through a plasma etch method employing a fluorine containing plasma and purging the reactor chamber with a mixture of silane in an inert gas. A mechanistic basis to justify a preference of nitrogen and hydrogen plasmas in conjunction with a nitrogen trifluoride plasma when forming with enhanced stability and uniformity tungsten layers through a chemical vapor deposition (CVD) method, but not tungsten silicide layers, is not readily apparent.

EXAMPLES

The method of the present invention was implemented within a manufacturing process for forming tungsten silicide layers over polysilicon layers which in turn were formed over (100) silicon semiconductor substrates. The tungsten silicide layers and the polysilicon layers were subsequently patterned to form tungsten silicide polycide gate electrodes within field effect transistors (FETs) formed within and upon the semiconductor substrates.

The tungsten silicide layers were formed through the chemical vapor deposition (CVD) method employing: (1) a reactor chamber pressure of about 800 mtorr; (2) a substrate temperature of about 350 degrees centigrade; (3) a tungsten hexafluoride flow rate of about 3.3 standard cubic centimeters per minute (sccm); (4) a silane flow rate of about 500 standard cubic centimeters per minute (sccm); and (5) an argon background flow rate of about 400 standard cubic centimeters per minute (sccm), for either a first deposition time of 60 about seconds which provided tungsten silicide layers of nominal thickness about 1500 angstroms or a second deposition time of about 80 seconds which provided tungsten silicide layers of nominal thickness about 2000 angstroms.

Within a conventional method employed prior to implementing within the manufacturing process the method of the present invention, the semiconductor substrates having formed thereupon the tungsten silicide layers were removed from the chemical vapor deposition (CVD) reactor chamber. The chemical vapor deposition (CVD) reactor chamber was then cleaned employing a plasma etch method with a fluorine containing plasma derived from nitrogen trifluoride. The plasma etch method was employed at: (1) a reactor chamber pressure of about 500 mtorr; (2) a radio frequency power of about 300 watts at a radio frequency of 13.56 MHZ; (3) a reactor chamber temperature of about 400 degrees centigrade; and (4) a nitrogen trifluoride flow rate of about 150 standard cubic centimeters per minute (sccm). The plasma etch method was undertaken for either a first time period of about 18 seconds when plasma etching tungsten silicide layer residues resulting from the tungsten silicide layers formed to the nominal thickness of about 1500 angstroms or for a second time period of about 20 seconds when plasma etching tungsten silicide layer residues formed from tungsten silicide layers formed to the nominal thickness of about 2000 angstroms.

The conventional method was then modified to provide the method of the present invention by purging the chemical vapor deposition (CVD) reactor chamber immediately after the nitrogen trifluoride plasma etch cleaning of the chemical vapor deposition (CVD) reactor chamber. The purge was undertaken with a mixture of silane and argon. The purge was employed at: (1) a reactor chamber pressure of about 500 mtorr; (2) a reactor chamber temperature of about 400 degrees centigrade; (3) a silane flow rate of about 500 standard cubic centimeters per minute (sccm); and (4) an argon flow rate of about 400 standard cubic centimeters per minute (sccm) for a time period of about 20 seconds.

After each tungsten silicide layer was formed upon a semiconductor substrate through either the conventional method or through the method of the present invention, the sheet resistance of the tungsten silicide layer was measured through methods as are conventional in the art. Sheet resistances for tungsten silicide layers formed within the same calendar week were grouped together and there was calculated from the measured values of the sheet resistances of the tungsten silicide layers the statistical parameters Cp and Cpk, through methods as are also conventional in the art (ie: Cp values were calculated as tungsten silicide layer sheet resistance specification range divided by six times the standard deviation of the measured tungsten silicide layer sheet resistance values for an individual week; Cpk values were calculated as the difference between the mean measured tungsten silicide layer sheet resistance values and either the upper or lower tungsten silicide layer sheet resistance specification value, divided by three times the standard deviation of the measured tungsten silicide layer sheet resistance values for an individual week).

Figure 3:
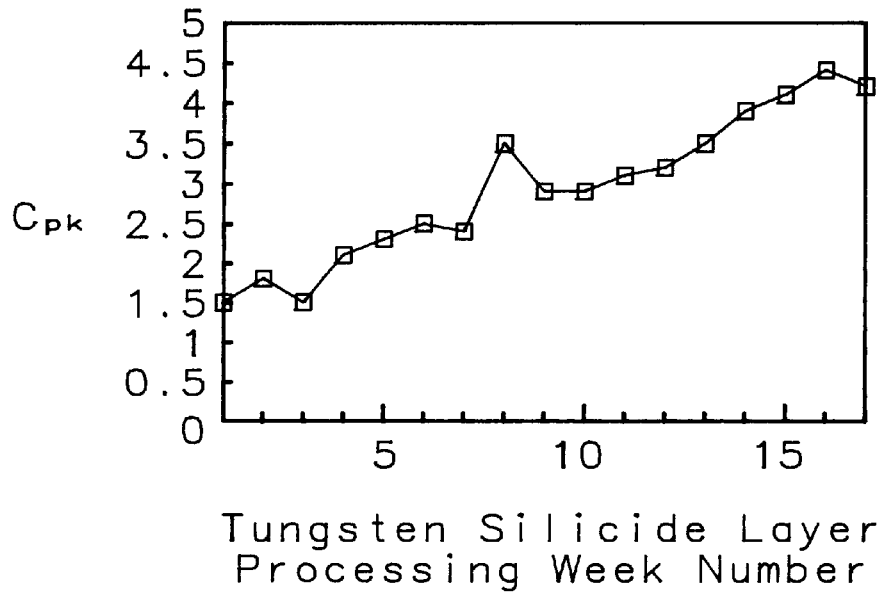
FIG. 3 and FIG. 4 show a pair of statistical process control (SPC) diagrams illustrating plots of Cpk versus Tungsten Silicide Layer Processing Week Number for forming tungsten silicide layers through a method conventional in the art in comparison with the method of the present invention.
Figure 4:
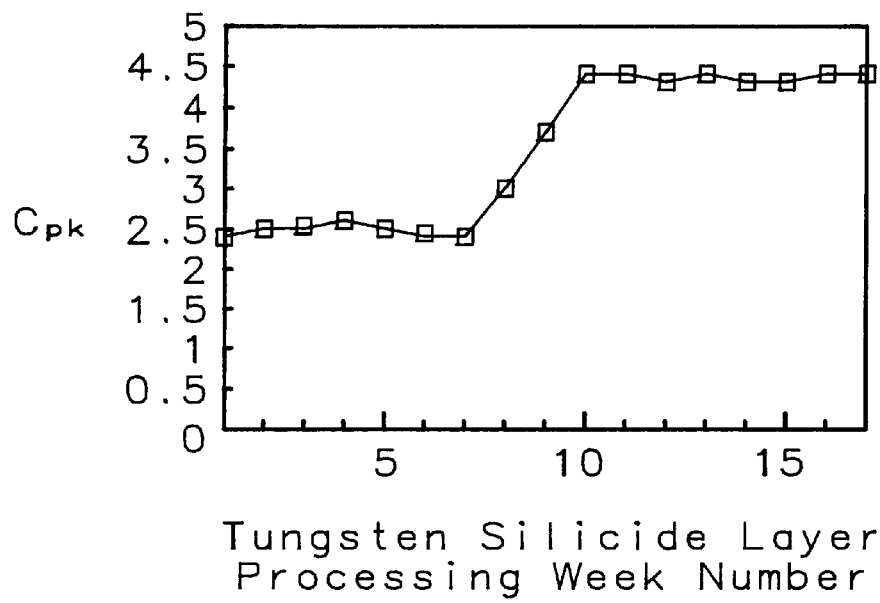

The values for Cpk as a function of tungsten silicide layer processing week for tungsten silicide layers of nominal thickness about 1500 angstroms are shown in FIG. 3, while the values for Cpk as a function of tungsten silicide processing week number for tungsten silicide layers of nominal thickness about 2000 angstroms are shown in FIG. 4. Although not shown in either FIG. 3 or FIG. 4, the calculated values of Cp substantially paralleled the calculated values of Cpk, thus the values of Cp are omitted from the graphs of FIG. 3 and FIG. 4 in order to provide clarity. Within both FIG. 3 and FIG. 4, there was implemented at Tungsten Silicide Layer Processing Week Number 8 a change from the conventional chemical vapor deposition (CVD) reactor chamber cleaning method employing only the fluorine containing plasma to the method of the present invention which employed the fluorine containing plasma cleaning method followed by the purge with the mixture of silane and argon.

As seen from the data of FIG. 3 and FIG. 4, and in particular from the data of FIG. 4, there is a substantial increase in sheet resistance uniformity of tungsten silicide layers formed through the method of the present invention in comparison with an otherwise equivalent method conventional in the art, where the otherwise equivalent method conventional in the art does not employ a purge process step after a plasma etch cleaning method.

As is understood by a person skilled in the art, the preferred embodiment and examples of the present invention are illustrative of the present invention rather than limiting of the present invention. Revisions and modifications may be made to materials, structures and dimensions through which is provided the preferred embodiment and examples of the present invention while still providing embodiments and examples which are within the spirit and scope of the present invention, as defined by the accompanying claims.

What is claimed is:

1. A method for cleaning a reactor chamber employed in forming through a chemical vapor deposition (CVD) method a tungsten silicide layer upon a substrate positioned within the reactor chamber comprising:

(1) removing from the reactor chamber the substrate having the tungsten silicide layer formed thereupon;

(2) cleaning the reactor chamber with a fluorine containing plasma; and (3) purging the reactor chamber with a mixture of silane and an inert gas absent plasma activation, wherein there is not employed intervening (2) and (3) an additional cleaning of the reactor chamber employing a plasma selected from the group of plasmas consisting of nitrogen plasmas and hydrogen plasmas.

2. The method of claim 1 wherein the fluorine containing plasma is formed from nitrogen trifluoride.

3. The method of claim 2 wherein the fluorine containing plasma is employed at:

a nitrogen trifluoride flow of about 100 to about 300 standard cubic centimeters per minute (sccm);

a reactor chamber pressure of about 100 to about 1000 mtorr;

a radio frequency power of about 100 to about 500 watts; and an exposure time of about 10 to about 30 seconds.

4. The method of claim 1 wherein the mixture of silane and the inert gas mixture is employed at:

a silane concentration of about 30 to about 70 volume percent; and an exposure time of about 5 to about 30 seconds.

5. The method of claim 1 wherein the tungsten silicide layer is formed employing silane as a silicon source material and tungsten hexafluoride as a tungsten source material.

6. A method for forming a tungsten silicide layer upon a substrate through a chemical vapor deposition (CVD) method comprising:

(1) forming upon a first substrate positioned within a reactor chamber a first tungsten silicide layer through a chemical vapor deposition (CVD) method;

(2) removing the first substrate from the reactor chamber;

(3) cleaning the reactor chamber with a fluorine containing plasma;

(4) purging the reactor chamber with a mixture of silane and an inert gas absent plasma activation; and (5) forming upon a second substrate positioned within the reactor chamber a second tungsten silicide layer through the chemical vapor deposition (CVD) method, wherein there is not employed intervening (3) and (4) an additional cleaning of the reactor chamber employing a plasma selected from the group of plasmas consisting of nitrogen plasmas and hydrogen plasmas.

7. The method of claim 6 wherein the fluorine containing plasma is formed from nitrogen trifluoride.

8. The method of claim 7 wherein the fluorine containing plasma is employed at:

a nitrogen trifluoride flow of about 100 to about 300 standard cubic centimeters per minute (sccm);

a reactor chamber pressure of about 100 to about 1000 mtorr;

a radio frequency power of about 100 to about 500 watts; and an exposure time of about 10 to about 30 seconds.

9. The method of claim 6 wherein the mixture of silane and the inert gas is employed at:

a silane concentration of about 30 to about 70 volume percent; and an exposure time of about 5 to about 30 seconds.

10. The method of claim 6 wherein:

the chemical vapor deposition (CVD) method employs silane as a silicon source material and tungsten hexafluoride as a tungsten source material; and by cleaning the reactor chamber with the fluorine containing plasma and then purging the reactor chamber with the mixture of silane and the inert gas there is provided the first tungsten silicide layer and the second tungsten silicide layer with enhanced sheet resistivity uniformity.

* * * * *